United States Patent [19]

Tran

[11] Patent Number: 5,734,729
[45] Date of Patent: Mar. 31, 1998

[54] APPARATUS FOR ELIMINATING AUDIO NOISE WHEN POWER IS CYCLED TO A COMPUTER

[75] Inventor: Thanh Thien Tran, Tomball, Tex.

[73] Assignee: Compaq Computer Corporation, Houston, Tex.

[21] Appl. No.: 591,220

[22] Filed: Jan. 17, 1996

[51] Int. Cl.$^6$ ................................................ H04B 15/00
[52] U.S. Cl. ........................................ 381/94.5; 381/120
[58] Field of Search ............................. 381/94, 110, 120

[56] References Cited

U.S. PATENT DOCUMENTS

| | | | |
|---|---|---|---|
| 4,499,335 | 2/1985 | Lyle | 381/111 |
| 5,029,005 | 7/1991 | Morris, Jr. | 455/212 |
| 5,151,942 | 9/1992 | Sasaki | 381/120 |
| 5,199,079 | 3/1993 | Anderson et al. | 381/120 |
| 5,224,010 | 6/1993 | Tran et al. | 361/90 |
| 5,488,665 | 1/1996 | Johnston et al. | 381/2 |

OTHER PUBLICATIONS

Philips Semiconductors Product Specification, Class AB Stereo Headphone Driver TDA1308 (Aug. 1996).
Philips Semiconductors RF Communications Products Specification, 3–Watt Mono BTL Audio Output Amplifier TDA7056A (Aug. 1991).
National Semiconductor Datasheets for LM4700 Overture™ and LM2876 Overture™ High Performance 40W Audio Power Amplifier with Mute (1995).
National Semiconductor, AN69, Dec. 1972, p. AN69–4.

*Primary Examiner*—Forester W. Isen
*Attorney, Agent, or Firm*—Pravel, Hewitt, Kimball & Krieger

[57] ABSTRACT

An audio power management system for a computer to eliminate audible noise associated with the cycling of power to an audio amplifier for a computer is disclosed. A diode is connected between the power supply rail and the power input to the audio amplifier. One or more decoupling capacitors is provided at the power input to the audio amplifier to insulate the audio amplifier from fluctuations at the voltage supply rail. The apparatus also briefly mutes the amplifier when power is cycled to eliminate transient noises.

Additionally, the audio power management system eliminates audible noise associated with the waking-up or putting the computer to sleep. The audio system asserts a speaker mute signal before power is removed from the amplifier to reduce transient conditions. During power up, the speaker mute signal is applied to the amplifier for a period after power has been applied to the amplifier. This control is economically accomplished using a minimal number of digital outputs.

16 Claims, 5 Drawing Sheets

APPARATUS FOR ELIMINATING AUDIO NOISE WHEN POWER IS CYCLED TO A COMPUTER

BACKGROUND OF THE INVENTION

1. Field of the Invention

This invention relates generally to an audio system for a computer and, more particularly, to an audio management system for eliminating noise generated when power is applied to or removed from the entire computer or portions of the computer.

2. Description of the Related Art

Driven by the users' needs for presenting graphic, sound, and imaging information to their peers, multimedia is one of the fastest growing applications for computer systems. Multimedia refers to the integration of text, audio, graphics, still image, and moving pictures into a single computer-controlled product. It includes the combination of computers, video or compact disc players, video monitors, optical scanners, audio cards, music synthesizers, etc., all linked together by powerful software.

The trend toward multimedia has resulted in an increasingly sophisticated computer sound system with sound quality comparable to compact disc players. To deliver this quality, it is common to provide separate audio amplifiers in the computer to drive high quality internal/external speakers or headphones. Further, the multimedia system typically provides an integral loud speaker and/or headphone jacks for the reproduction of sound, such as a power on "boot-beep" sound, alert sound, voice annotation, and music.

The presence of the integral audio amplifier and the loud speaker presents certain unique problems associated with the cycling of power to the computer. Typically, the rapid removal or application of power to the audio system produces extraneous and annoying sounds usually characterized as "clicks" and "pops." The clicks and pops can be caused by the sudden removal of power from the audio amplifier assembly and the exposure of the audio amplifier to voltages that are outside of the recommended operating range of the amplifier. Alternatively, clicks and pops can be introduced when the audio input to the audio amplifier becomes unstable before power has been removed from the audio amplifier assembly. In either case, the audio amplifier generates one or more annoying pops or clicks through the speakers. It is desirable to eliminate the noisy sounds when power is cycled to the computer system. Further, the number of digital pins to control this activity may be limited, rendering the control even more difficult. Thus, a low pin-count method is needed to control the pops or clicks associated with the turning on and off of the multimedia computer.

In a separate trend, efficient power management of the computer is important for many reasons, including the conservation of energy and the protection of the environment. Many of today's desktop personal computers offer power-down capability to conserve energy. In such a system, the computer automatically powers down the disk drive and removes power from certain electronics when the computer has been idle for a certain period of time. Upon detecting keyboard activities or other predefined activating events, the computer automatically "wakes-up" by applying power to various electronic subsystems. Further, in applications that do not require audio, it is desirable to remove power from the audio system by putting it to "sleep." However, the powering-up or down of the audio system for energy conservation purposes also results in pops and snaps as power is cycled to the audio amplifier. However, now the pops and snaps will no longer be associated only with the larger event of system activation. Indeed, the pops and snaps will generally occur when the computer is not being used. This seemingly random popping and snapping thus is a problem which must be solved. Additionally, the elimination of the random popping and snapping needs to be performed using a minimum number of digital control pins.

SUMMARY OF THE INVENTION

A computer audio power management system is provided which eliminates audible noise associated with the turning on and off of the entire or parts of the computer. The computer has a power supply which provides a POWERGOOD signal to indicate that the supply voltage has reached an acceptable and stable operating level. When deasserted, POWERGOOD effectively grounds the volume input of the audio amplifier to mute the audio amplifier and to eliminate transient audible noise generated by the cycling of power to the audio amplifier.

Additionally, the present invention provides a diode which is connected between the power supply rail and the voltage input to the audio amplifier as well as decoupling capacitors. Upon the removal of power, the diode becomes reversed biased and isolates the supply rail from the voltage input to the audio amplifier and decoupling capacitors. The energy stored in the decoupling capacitors is provided to the audio amplifier so that the supply voltage to the audio amplifier decays slowly. The result is an ordered shut-down of the audio system without pops, clicks, or snaps using only one digital signal.

In another embodiment, the audio power management system additionally eliminates audible noise associated with the waking-up or putting the computer to sleep. During the sleep mode, the audio system asserts a speaker mute signal before power is removed from the amplifier to reduce transient noises. During the wake-up mode, the speaker mute signal is applied to the amplifier for a period after power has been applied to the amplifier. This control is economically accomplished using a single digital output. These and other features of the present invention will be understood upon reading of the following description along with the drawings.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
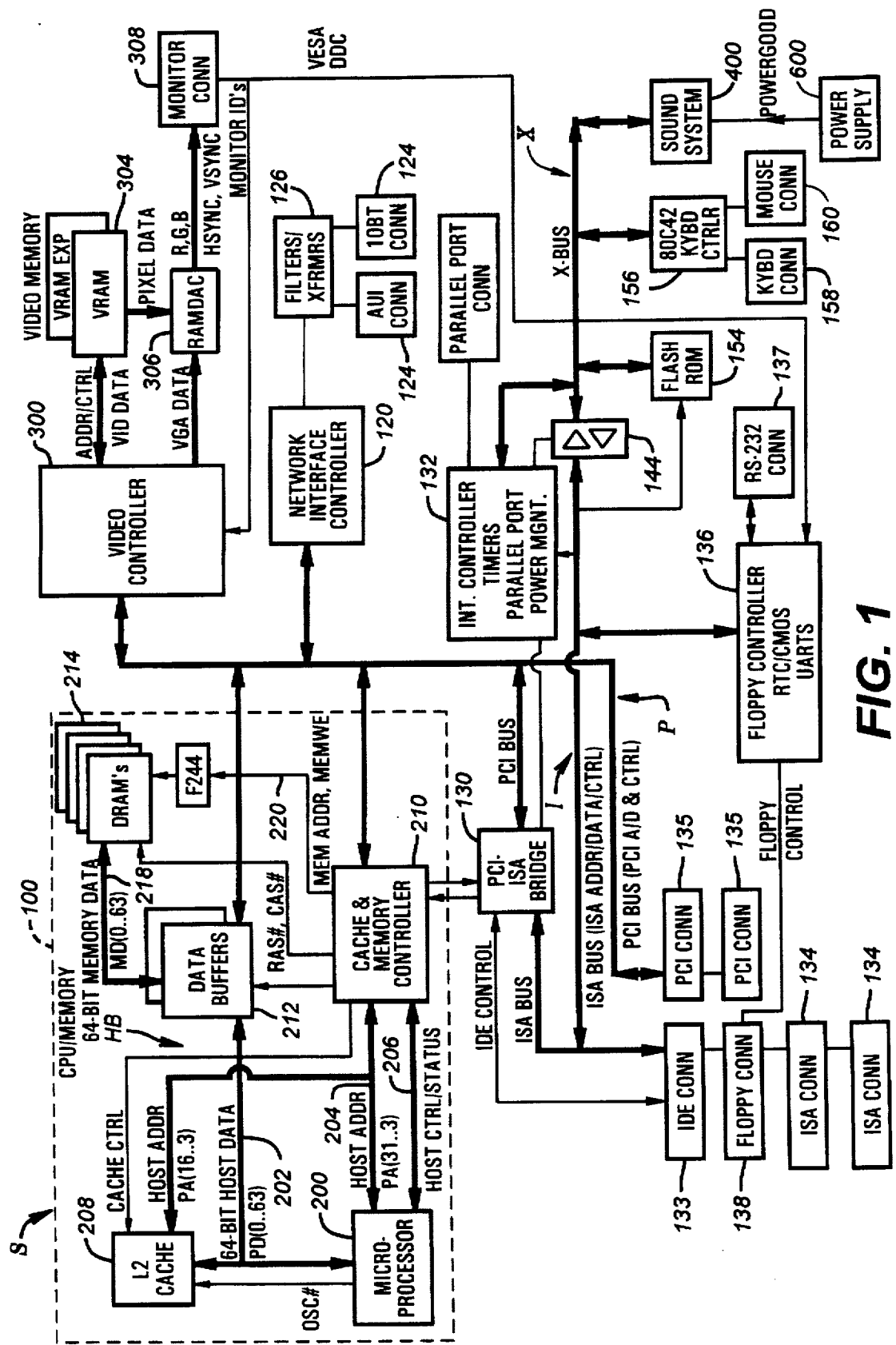
FIG. 1 is a block diagram of a computer system having an audio system according to the invention.

Referring to FIG. 1, a computer system S having an audio subsystem according to the present invention is shown. This is an exemplary computer system S and other variations could readily be developed by one skilled in the art. In the preferred embodiment, two primary buses are provided for the system S. The first bus is the PCI or Peripheral Component Interconnect bus P which includes an address/data portion and control signal portion. The second primary bus in the system S is the ISA bus I. The ISA bus I includes an address portion, a data portion 110, and a control signal portion 112. The PCI and ISA buses P and I form the backbones of the system S.

A CPU/memory subsystem 100 is connected to the PCI bus P. The processor 200 is preferably a Pentium processor from Intel, preferably operating externally at 60 or 66 MHz, but could be an 80486 from Intel or processors compatible with the 80486 or Pentium or other processors if desired. The processor 200 provides data, address, and control portions 202, 204, 206 to form a host bus HB. A level 2 (L2) or external cache memory system 208 is connected to the host bus HB to provide additional caching capabilities to improve performance of the computer system. The L2 cache 208 may be permanently installed or may be removable if desired. A cache and memory controller and PCI bridge chip 210, such as the 82434X chip from Intel Corporation or the chip described in patent applications Ser. Nos. 08/324,016, entitled "SINGLE BANK, MULTIPLE WAY CACHE MEMORY" and 08/324,246, entitled "MEMORY CONTROLLER WITH WRITE POSTING QUEUES FOR PROCESSOR AND I/O BUS OPERATIONS AND ORDERING LOGIC FOR CONTROLLING THE QUEUES", filed Oct. 14, 1994 and hereby incorporated by reference, is connected to the control portion 206 and to the address portion 204. The bridge chip 210 is connected to the L2 cache 208 as it incorporates the cache controller and therefore controls the operation of the cache memory devices in the L2 cache 208. The bridge chip 210 is also connected to control a series of data buffers 212. The data buffers 212 are preferably similar to the 82433LX from Intel, or those described in patent applications Ser. Nos. 08/324,246 as incorporated above and 08/323,263, entitled "DATA ERROR DETECTION AND CORRECTION SYSTEM", filed Oct. 14, 1994 issued as U.S. Pat. No. 5,555,250 on Sep. 10, 1996, and hereby incorporated by reference, and are utilized to handle memory data to a main memory array 214. The data buffers 212 are connected to the processor data portion 202 and receive control signals from the bridge chip 210. The data buffers 212 are also connected to the PCI bus P for data transfer over that bus. The data buffers 212 provide a memory data bus 218 to the memory array 214, while a memory address and memory control signal bus 220 is provided from the bridge chip 210.

A video controller 300 is connected to the PCI bus P. Video memory 304 is used to store the graphics data and is connected to the video graphics controller 300 and a digital/analog converter (RAMDAC) 306. The video graphics controller 300 controls the operation of the video memory 304, allowing data to be written and retrieved as required. A video connector 308 is connected to the RAMDAC 306. A monitor (not shown) is connected to the video connector 308.

A network interface controller (NIC) 120 is connected to the PCI bus P. Preferably the controller 120 is a single integrated circuit and includes the capabilities necessary to act as a PCI bus master and slave and the circuitry to act as an Ethernet interface. Alternate Ethernet connectors 124 are provided on the system S and are connected to filter and transformer circuitry 126, which in turn is connected to the controller 120. This forms a network or Ethernet connection for connecting the computer system S to a local area network (LAN).

A PCI-ISA bridge 130 is provided to convert signals between the PCI bus P and the ISA bus I. The PCI-ISA bridge 130 includes the necessary address and data buffers and latches, arbitration and bus master control logic for the PCI bus, ISA arbitration circuitry, an ISA bus controller as conventionally used in ISA systems, an IDE (integrated drive electronics) interface, and a DMA controller. Preferably the PCI-ISA bridge 130 is a single integrated circuit, but other combinations are possible. A series of ISA slots 134 are connected to the ISA bus I to receive ISA adapter cards. A series of IDE slots 133 are connected to the ISA bus I and the PCI-ISA bridge chip 130 to receive various IDE devices, such as hard disk drives, tape drives and CD-ROM drives. A series of PCI slots 135 are connected to the PCI bus P to receive PCI adapter cards.

A combination I/O chip 136 is connected to the ISA bus I. The combination I/O chip 136 preferably includes a floppy disk controller, real time clock (RTC), CMOS memory, two UARTs, and various address decode logic. A floppy disk connector 138 for receiving a cable to a floppy disk drive is connected to the combination I/O chip 136 and the ISA bus I. Serial port connectors 137 are also connected to the combination I/O chip 136. A data buffer 144 is connected to the ISA bus I to provide an additional X bus X for various additional components of the computer system, including an audio system 400 which provides various audio functions to the computer system S according to the present invention. A flash ROM 154 receives its control, data and address signals from the X bus X for data transfer. Preferably the flash ROM 154 contains the BIOS information for the computer system and can be reprogrammed to allow for revisions of the BIOS. An 8042 or keyboard controller 156 is connected to the X bus X. The keyboard controller 156 is of conventional design and is connected in turn to a keyboard connector 158 and a mouse or pointing device connector 160. Additionally, a miscellaneous system logic chip 132 is connected to the X bus X. The miscellaneous system logic chip 132 contains counters and timers as conventionally present in personal computer systems, an interrupt controller for both the PCI and ISA buses P and I, enhanced parallel port circuitry and power management logic, as well as other miscellaneous circuitry.

The computer system S relies on a regulated power supply 600 which is connected to all components and which provides stable power for various circuits in the system to reduce loss of data or other functional system errors caused by unstable or varying power supply voltages. Unstable or indeterminate operation of the components in such systems can also occur during transient operating events, particularly power-up. In addition, a fault in the regulated power supply 600 which causes over voltage or under voltage power supply levels can, if applied to system components while operating, cause temporary or permanent failures of the components. Accordingly, power supply monitoring and control circuits, as discussed subsequently, are used in the computer system S to monitor the output of the regulated power supply 600 in the system and to disable the components from operating when the output voltages are outside the desired range. The power supply 600 provides a POWERGOOD signal which is used by a plurality of systems, including the audio system 400. POWERGOOD is a TTL signal which indicates that the power supply voltages presented by the regulated power supply 600 are at the proper voltages, and that no power supply fault exists. POWERGOOD can be used to enable system components such as the CPU to operate; conversely, POWERGOOD can be considered as a reset signal so that components such as the CPU receiving the signal enter a reset, standby, or other non-operating state responsive to the POWERGOOD line indicating a fault. Specific details on the power supply 600 and POWERGOOD are disclosed in U.S. Pat. No. 5,224,010, issued to Tran, et al., and assigned to the present assignee, the content of which is incorporated herein by reference as if fully set forth.

Figure 2:
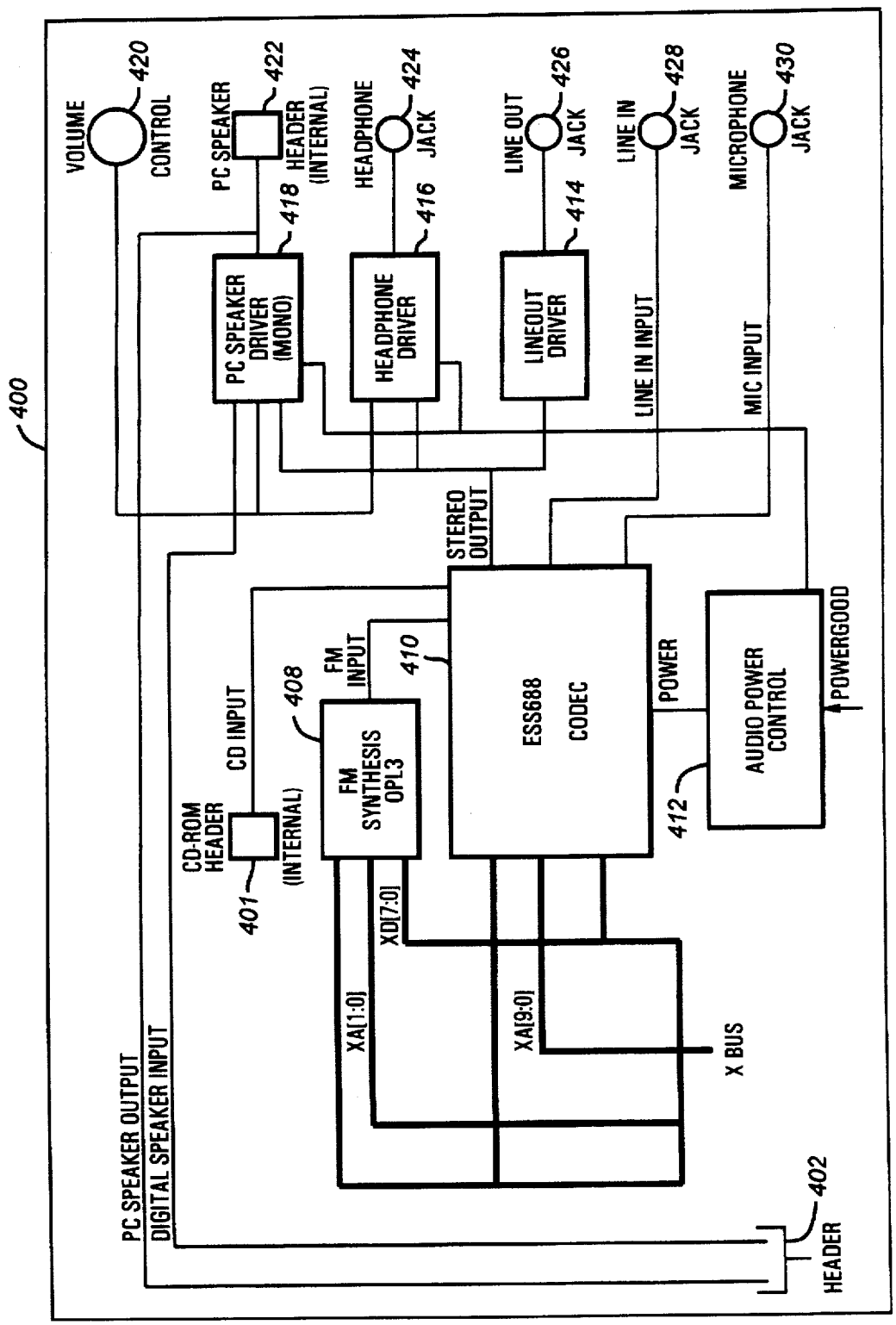
FIG. 2 is a block diagram of an audio system in accordance with the invention.

Turning now to FIG. 2, the audio subsystem 400 is discussed in greater detail. The audio system 400 has a CD-ROM header 401 which carries a CD-ROM audio output signal and a speaker header 402 which carries the speaker output and input signals for the computer system S to allow integration with the speaker normally provided in a computer system S without the audio system 400. The control, address, and data signals of the X bus X are provided to an FM synthesis device 408 and a CODEC 410. The FM synthesis device 408 provides its analog output as an input to the CODEC 410. The CODEC 410, available from a number of suppliers, is preferably a 16-bit stereo CODEC with an analog to digital converter, a digital to analog converter, and a digital interface for communicating with internal registers in the CODEC 510.

As further shown in FIG. 2, the CODEC 410 provides analog stereo outputs to a line out driver 414, the headphone driver 416, and the PC speaker driver 418. The audio system 400 also includes a volume control potentiometer 420 which provides volume level signals to the headphone driver 416 and the speaker driver 418. A speaker header 422 is provided to route the speaker output signal from the speaker driver 418 to the internal speaker of the computer system S. A headphone jack 424 provides for the electrical connection between a headphone, not shown, and the headphone driver 416. Similarly, a line out jack 426 provides electrical access to the output of the line out driver 414. A line-in jack 428 and a microphone jack 430 are provided on the audio system 400 to couple the appropriate devices to the analog inputs on the CODEC 410. The CODEC 410, headphone driver 416, and the speaker driver 418 receive status signals of the computer's power supply rail from an audio power control unit 412. The audio power control unit 412 also receives a POWER signal from a general purpose digital I/O bit of the CODEC 410 to signal that portions of the computer or the entire computer is in a sleep mode or a wake-up mode.

Figure 3:
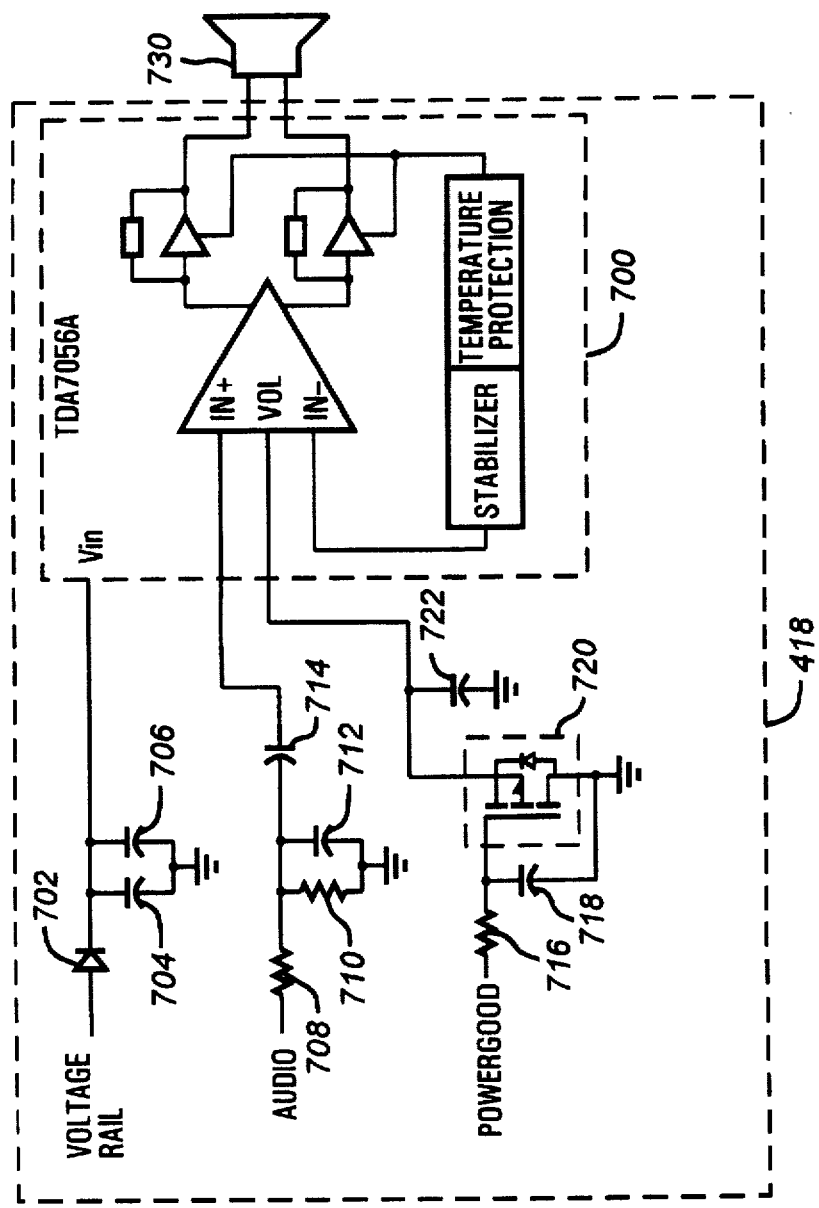
FIG. 3 is a schematic diagram of a first embodiment of the audio subsystem to eliminate noise during the cycling of power to the computer.

Turning to FIG. 3, the audio power control circuitry to eliminate the pops and clicks generated during the turning on and turning off of the entire system S is disclosed. In FIG. 3, POWERGOOD is utilized to mute the audio amplifier of the computer system S during the period wherein the power supply 600 is unstable. The audio amplifier 700 has a number of inputs, including a voltage input, audio input, volume control input, and audio outputs. The audio amplifier 700 is preferably a Philips Semiconductor device TDA7056A, with two audio amplifiers 700 in the headphone device 416 and one audio amplifier 700 is the PC speaker drive 418. The TDA7056A is an amplifier with a DC volume control. The DC volume control has a logarithmic control characteristic; in the event that the DC volume control voltage is below 0.3 V, the device switches to the mute mode.

During the shutdown of the computer, other subsystems of the computer system S, such as disk drives, may rapidly drain remaining power from the supply rail. A very fast cut-off of power from the amplifier 700 will cause the amplifier 700 to operate outside of the recommended range, possibly resulting in clicks, pops, or snaps even though the mute input may be asserted. To prevent this problem, a switch in the form of a diode 702 is provided to isolate the voltage supply input to the amplifier from the power supply rail during the shut-down of the computer. Further, an energy reservoir is provided for a graceful removal of power from the amplifier.

As shown in FIG. 3, the voltage input of the audio amplifier 700 is connected to the diode 702. The anode end of the diode 702 is connected to a 12 volt power supply rail of the power supply 600, while the cathode end of the diode 702 is connected to the voltage input of the audio amplifier 700. A plurality of energy reservoirs, or decoupling capacitors 704-706, are connected in parallel to the cathode end of the diode 702. As is typical for decoupling application, the other ends of capacitors 704 and 706 are grounded. For power-down, the diode 702 becomes reversed biased, which isolates the voltage supply rail from the decoupling capacitors 704-706 and the voltage input to the audio amplifier 700. The energy stored in the decoupling capacitors 704-706 is provided to the audio amplifier 700 so that the supply voltage to the audio amplifier 700 decays slowly. The result is an ordered shut-down of the audio system without pops, clicks, or snaps.

Turning to the audio input to the amplifier 700, an audio signal generated by the CODEC 410 is presented to one end of a resistor 708. The second end of the resistor 708 is connected to an RC combination having a resistor 710 and a capacitor 712 connected in parallel at their first ends and grounded at their second ends. The second end of the resistor 708 and the first ends of the resistor 710 and capacitor 712 are connected to one end of a capacitor 714. The other end of the capacitor 714 is connected to the audio input of the audio amplifier 700. The combination of resistors 708-710 and capacitors 712-714 forms a low-pass filter to eliminate signals outside of the audio bandwidth. Additionally, the resistors 708-710 and capacitors 712-714 protect the audio amplifier 700 from electromagnetic interference (EMI) related noise.

Turning to the muting circuit, POWERGOOD is presented to a resistor 716 at one end while the second end of the resistor 716 is connected to the first end of a capacitor 718. The other end of the capacitor 718 is grounded. The RC combination 716-718 eliminates EMI related noise generated by the power supply 600 from radiating through the audio amplifier 700. The first end of the capacitor 718 is connected in turn to the gate input of a p-channel MOSFET transistor 720. The source of the MOSFET 720 is grounded, while the drain of the MOSFET 720 is connected to the volume input of the audio amplifier 700. Additionally, a decoupling capacitor 722 is connected at one end to the volume input of the audio amplifier 700, while the other end of the capacitor 722 is grounded. The MOSFET 720 is preferably a J176 available from a number of sources, including Philips Semiconductors. The MOSFET 720 isolates the TTL level of POWERGOOD from the internal bias requirement of the TDA7056A. When POWERGOOD is deasserted, the MOSFET 720 conducts and effectively pulls the DC volume control voltage of the audio amplifier 700 below 0.3 V to mute the audio system. Thus, the audio system is muted shortly during power-on and power-off while the power supply 400 is not stable. The audio outputs of the audio amplifier 700 are subsequently connected to a speaker 730 which directs audio feedback to the user.

While a single audio amplifier arrangement has been described in FIG. 3 to provide a monaural output, one skilled in the art would understand that a second identical audio amplifier system which is connected to a second audio signal can be utilized in conjunction with the audio amplifier system of FIG. 3 to provide a stereo audio output.

Figure 4:
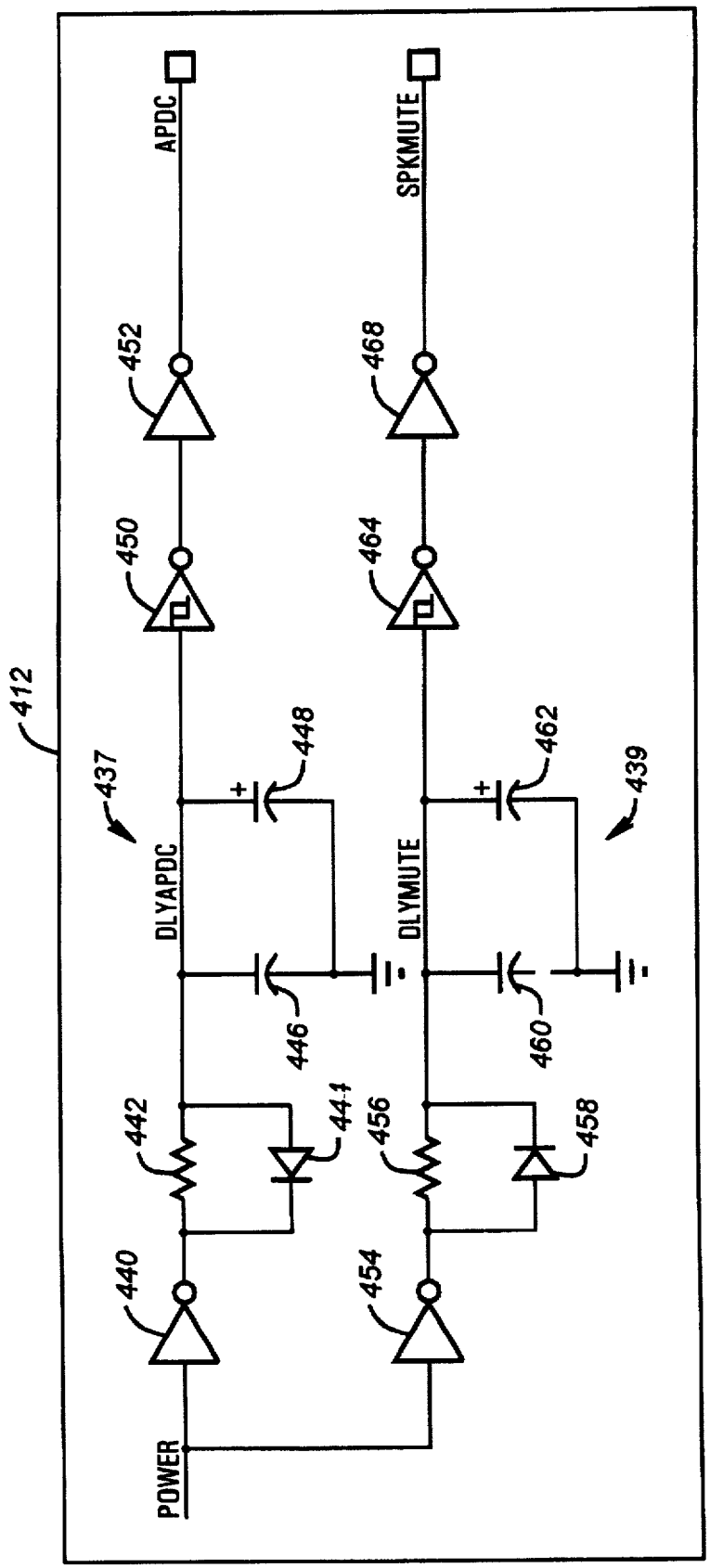
FIG. 4 is a schematic diagram of portions of a second embodiment of the audio system to eliminate noise when the computer enters or exits its power saving mode.
Figure 5:
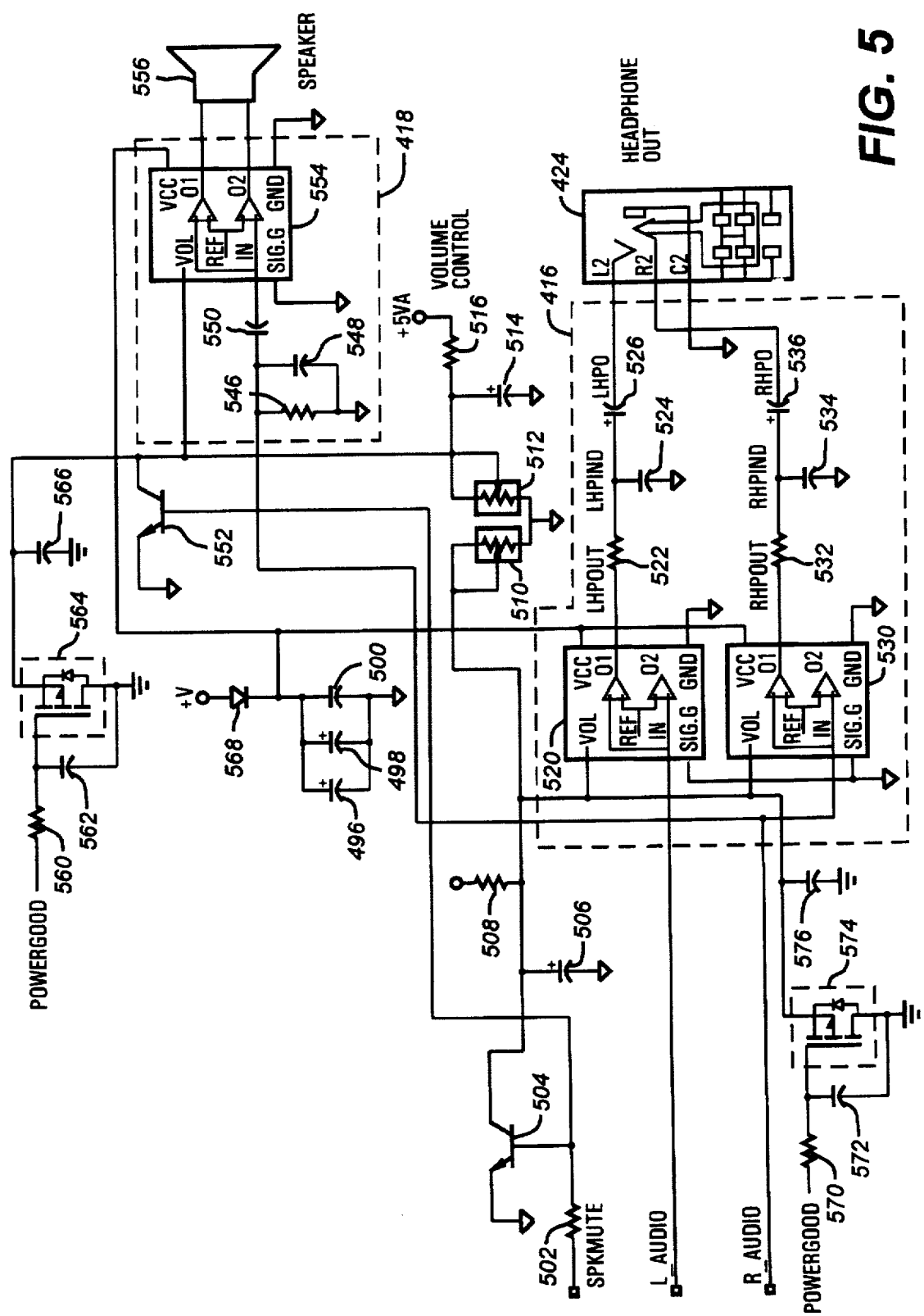
FIG. 5 is a schematic diagram of further portions of the second embodiment of the audio system to eliminate noise during both power cycling and entering or exiting power saving mode.

Turning to FIGS. 4 and 5, a second embodiment of the audio system 400 which supports systems with power saving capability, or "green PCs," is discussed. The circuits shown in FIGS. 4 and 5 additionally protect the user from noise generated during the "sleep" or "wake-up" modes of the computer system S or from the selective power-on or off of only the audio subsystem for power saving purposes. In FIG. 4, POWER is provided to a pair of delay generators 437 and 439. In delay generator 437, POWER is provided to an inverter 440 whose output is connected in parallel to a resistor 442 and the cathode end of a diode 444. The other end of the resistor 442 and the anode end of the diode 444 are connected to one end of capacitors 446 and 448, whose other ends are connected to ground, and further connected to the input of an inverter 450. The output of the inverter 450 is connected to the input of an inverter 452 to generate an auto power down control (APDC) signal at the output of the inverter 452.

Similarly, in the second delay generator 439, POWER is connected to an inverter 454 whose output is connected in parallel to a resistor 456 and the anode end of a diode 458. The other end of the resistor 456 and the cathode end of the diode 458 are connected to one of capacitors 460 and 462, whose other ends are connected to ground, and further connected to the input of an inverter 464. The output of the inverter 464 is connected to the input of an inverter 468 to generate the speaker mute (SPKMUTE) signal at the output of the inverter 468. The inverters 450 and 464 preferably have Schmitt triggered inputs to avoid oscillation, as the input signal has an analog transition rather than a standard digital transition.

When the computer system S has been idle for a period of time, the power-down sequence is performed. Details of determining the idle condition and the power-down sequence are not provided here for simplicity and because they are well known. An early example is provided in U.S. Pat. No. 4,980,836. During this power-down sequence, POWER is negated by driving the signal low. The inverters 440 and 454 negate the logic low input into a logic high level at the outputs. The forward biasing of the diode 458 allows the high signal to effectively bypass the resistor 456 to allow the capacitors 460 and 462 to be rapidly charged by the inverter 454. Thus, the SPKMUTE signal goes high a very short delay after the POWER signal is driven low. In contrast, the inverted POWER signal from the inverter 440 is forced to go through the resistor 442, as the diode 444 is reverse biased, which in combination with capacitors 446 and 448, provides a longer delay. The APDC signal then is asserted after the longer delay, much longer than the delay in the SPKMUTE signal. Therefore, the SPKMUTE signal is active a brief period before the APDC signal becomes active when the computer powers down. This allows the audio output to be muted before the amplifiers are turned off, so that the pops and snaps caused by the power-down are eliminated.

When the computer system S wakes up from its power down condition, POWER is asserted. The inverters 440 and 454 negate the high input into a logic low level at the outputs. The forward biasing of the diode 444 allows the signal to effectively bypass the resistor 442 so that the APDC signal is negated relatively quickly. In contrast, the SPKMUTE signal experiences a greater delay as the low output of the inverter 454 reverse biases the diode 458 so that the resistor 456 and capacitors 460, 462 form the discharging circuit. Therefore, the APDC signal is negated a brief period before the SPKMUTE signal is negated. Thus, because the SPKMUTE signal is deasserted after power has been applied, the pops and snaps caused by the power-up are eliminated.

Referring to FIG. 5, the remaining power and driver circuits as used in conjunction with the outputs of the audio power control block 412, are shown in detail.

Turning to the top left of FIG. 5, a diode 568 is connected in a back-biased manner so as to provide a one way flow of current to audio amplifiers 520, 530 and 554. The anode end of the diode 568 is connected to the supply voltage, while the cathode end of the diode 568 is connected to a plurality of decoupling capacitors 496, 498, and 500, as well as the voltage supply inputs of audio amplifiers 520, 530, and 554. During the cycling of power to the entire computer system S, the diode 568 becomes reversed biased to isolate the voltage supply rail from the decoupling capacitors 496–500 and the voltage input to the audio amplifiers 520, 530 and 554. Upon the cut-off of power, the diode 568 isolates the voltage available to the audio system 400, while the energy stored in the decoupling capacitors 496–500 is provided to the audio amplifiers 520, 530, 554 so that the supply voltage to the audio amplifiers 520, 530, 554 decays slowly to ensure a controllable shutdown without audible noises.

Turning to the lower left corner of FIG. 5, the SPKMUTE signal from the inverter 468 is provided to the base of an NPN transistor 504, whose emitter is grounded. The collector of the transistor 504 is connected to a pull-up resistor 508, a decoupling capacitor 506, and the volume control input of the amplifiers 520 and 530. The collector of the transistor 504 is also connected to one end of a potentiometer 510 for adjusting the headphone volume, while the other end of the potentiometer 510 is grounded. When the SPKMUTE signal is asserted, the volume inputs of the amplifiers 520 and 530 are clamped to a low level, muting the amplifiers 520 and 530.

The volume control input of each of the amplifiers 520, 530 is also connected to a circuit which eliminates noise during the cycling of power to the computer. In FIG. 5, POWERGOOD is provided to a resistor 570 at one end while the second end of the resistor 570 is connected to the first end of a capacitor 572. The other end of the capacitor 572 is grounded. The RC combination 570–572 eliminates EMI related noise generated by the power supply 600 from radiating through the audio amplifiers 520, 530. The first end of the capacitor 572 is connected in turn to the gate input of a p-channel MOSFET transistor 574. The source input of the MOSFET 574 is grounded, while the drain of the MOSFET 574 is connected to each volume input of audio amplifiers 520 and 530. Additionally, a decoupling capacitor 576 is connected at one end to each volume input of audio amplifiers 520 and 530, while the other end of the capacitor 566 is grounded. The MOSFET 574 is preferably a J176 available from a number of sources, including Philips Semiconductors. The MOSFET 574 isolates the TTL level of POWERGOOD from the internal bias requirement of the audio amplifiers 520 and 530. When POWERGOOD is deasserted, the MOSFET 574 conducts and effectively pulls the DC volume control voltage of the audio amplifiers 520 and 530 below 0.3 V to mute the audio system.

As shown in the lower right section of FIG. 5, the left audio (L_AUDIO) signal is provided to the input of the amplifier 520 which generates the left headphone output (LHPOUT), while the right audio (R_AUDIO) signal is provided to the input of the amplifier 530 which generates the right headphone output (RHPOUT). The output of the amplifier 520 is connected to one end of resistor 522, while the other end of the resistor 522 is connected to a decoupling capacitor 524 and an AC-coupling capacitor 526. The second end of the capacitor 526 is connected to the left headphone input of headphone jack 424. Similarly, the output of amplifier 530 is connected to one end of a resistor 532, while the other end of the resistor 532 is connected to a decoupling capacitor 534 and an AC-coupling capacitor 536, which in turn is connected to the right headphone input of the headphone jack 424.

Referring to the upper right corner of FIG. 5, the support circuits associated with the amplifier 554 for the internal speaker 556 are shown in detail. The SPKMUTE signal from the inverter 468 is coupled to the base terminal of an NPN transistor 552, whose emitter is grounded. The collector terminal of the transistor 552 is connected to the volume control input of the amplifier 554 so that the amplifier 554 can be muted upon the assertion of the SPKMUTE signal. The volume control output of the amplifier 554 is further connected to the combination of a potentiometer 512, a capacitor 514, and a resistor 516 for adjusting the loudness of the speaker 550 when the amplifier 554 is not being muted.

The volume control input of the amplifier 554 is also connected to a circuit which eliminates noise during the cycling of power to the computer. As shown in the upper right corner of FIG. 5, POWERGOOD is provided to a resistor 560 at one end while the second end of the resistor 560 is connected to the first end of a capacitor 562. The other end of the capacitor 562 is grounded. The RC combination 560–562 eliminates EMI related noise generated by the power supply 600 from radiating through the audio amplifier 554. The first end of the capacitor 562 is connected in turn to the gate input of a p-channel MOSFET transistor 564. The source input of the MOSFET 564 is grounded, while the drain of the MOSFET 564 is connected to the volume input of the audio amplifier 554. Additionally, a decoupling capacitor 566 is connected at one end to the volume input of the audio amplifier 554, while the other end of the capacitor 566 is grounded. The MOSFET 564 is preferably a J176 available from a number of sources, including Philips Semiconductors. The FET 566 isolates the TTL level of POWERGOOD from the internal bias requirement of the audio amplifiers 520 and 530. When the computer is turned off, POWERGOOD is deasserted which causes the MOSFET 564 to conduct and pull the DC volume control voltage of the audio amplifier 554 below 0.3 V to mute the audio system.

In the preferred embodiment, the right audio signal is connected in parallel to a resistor 546 and a capacitor 548. Further, the right audio signal is AC-coupled through a capacitor 550 to the input of the amplifier 554. The output of the amplifier 554 is then delivered to the speaker 556 for communicating audio information to the user. Although the preferred embodiment discloses a monaural speaker system, a stereo speaker system can be implemented using a second amplifier to handle the left audio signal in conjunction with the amplifier 554 which handles the right audio signal.

When the computer system S powers-up from a power conservation power-down state, the SPKMUTE signal is active a brief period longer than the APDC signal is active so that the amplifier is muted while the amplifier is turning on. It can also be seen that when the computer system S powers-down during a power conservation operation, the SPKMUTE signal is active before the APDC signal becomes active so that muting occurs before the removal of power from the audio amplifier. Thus, the pops and snaps caused by waking-up or putting the computer system S to sleep are eliminated, with this control being performed using only a minimal number of digital control pins.

Additionally, the pops, snaps or clicks generated during the larger event of turning on or off the entire computer system S are also eliminated. For a shut-down, the diode 568 isolates the voltage supply rail from the decoupling capacitors 496–500 and the voltage input to the audio amplifiers 520, 530 and 554. The energy stored in the decoupling capacitors 496–500 is provided to the audio amplifiers 520, 530 and 554 so that the supply voltage to each audio amplifier decays slowly. The result is an ordered shut-down of the audio amplifiers 520, 530 and 554. Further, when POWERGOOD is deasserted to indicate that power is no longer within operating range, the FETs 564 and 574 immediately mute the audio amplifiers 520, 530 and 554 via their DC volume control inputs. Thus, the audio system is effectively muted for a brief period immediately after AC power is applied and before AC power is removed. The combination of the muting control and the isolation of the supply voltage to the audio amplifier provides a cost effective apparatus to eliminate the pops, clicks or snaps associated with the cycling of power to the computer system S.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

I claim:

1. An apparatus for controlling speaker noise resulting from transients generated by the cycling of power to a computer system, said computer system having a voltage supply rail, a status signal indicative of the stability of power on said voltage supply rail, and having an audio signal, said apparatus comprising:

an amplifier for amplifying said audio signal, said amplifier having a volume control input and a power supply input;

a power switch coupled between said voltage supply rail and said power supply input of said amplifier, said power switch enabling power to be transferred only from said voltage supply rail to said power supply input of said amplifier;

an energy reservoir coupled to said power supply input of said amplifier; and a mute switch having a control input coupled to said status signal and an output coupled to said volume control input of said amplifier, said mute switch muting said amplifier upon the assertion of said status signal.

2. The apparatus of claim 1, wherein said energy reservoir is one or more capacitors.

3. The apparatus of claim 1, wherein said amplifier has an audio input for receiving said audio signal, said apparatus further comprising a low-pass filter coupled between said audio signal and said audio input.

4. The apparatus of claim 3, wherein said low-pass filter further comprises:

a first resistor having a first end and a second end, said first end coupled to said audio input;

a second resistor and a first capacitor having first ends coupled to the second end of said first resistor and having second ends coupled to ground;

a second capacitor having a first end coupled to said second end of said first resistor and a second end coupled to said audio input of said amplifier.

5. The apparatus of claim 1, further comprising an electromagnetic interference filter coupled between said status signal and said control input of said mute switch.

6. The apparatus of claim 5, wherein said electromagnetic interference filter comprises:

a resistor having a first end coupled to said status signal and a second end coupled to said control input of said mute switch; and a capacitor having a first end connected to said control input of said mute switch and a second end coupled to ground.

7. The apparatus of claim 1, wherein said power switch is a diode having cathode and anode ends, said anode end coupled to said voltage supply rail, said cathode end coupled to said power supply input of said amplifier.

8. The apparatus of claim 1, wherein said computer system has a second audio signal, said apparatus further comprising:

a second amplifier for amplifying said second audio signal, said second amplifier having a volume control input and a power supply input;

a second power switch coupled between said voltage supply rail and said power supply input of said second amplifier, said second power switch enabling power to be transferred only from said voltage supply rail to said power supply input of said second amplifier;

a second energy reservoir coupled to said power supply input of said second amplifier; and a second mute switch having a control input coupled to said status signal and an output coupled to said volume control input of said second amplifier, said second mute switch muting said second amplifier upon the assertion of said status signal.

9. A computer system comprising:

a voltage supply rail;

a status signal indicative of the stability of power on said voltage supply rail;

a CODEC for generating an audio signal;

an amplifier for amplifying said audio signal, said amplifier having a volume control input and a power supply input;

a power switch coupled between said voltage supply rail and said power supply input of said amplifier, said power switch enabling power to be transferred only from said voltage supply rail to said power supply input of said amplifier;

an energy reservoir coupled to said power supply input of said amplifier; and a mute switch having a control input coupled to said status signal and an output coupled to said volume control input of said amplifier, said mute switch muting said amplifier upon the assertion of said status signal.

10. The computer system of claim 9, wherein said energy reservoir is one or more capacitors.

11. The computer system of claim 9, wherein said amplifier has an audio input for receiving said audio signal, said apparatus further comprising a low-pass filter coupled between said audio signal and said audio input.

12. The computer system of claim 11, wherein said low-pass filter further comprises:

a first resistor having a first end and a second end, said first end coupled to said audio input;

a second resistor and a first capacitor having first ends coupled to the second end of said first resistor and having second ends coupled to ground;

a second capacitor having a first end coupled to said second end of said first resistor and a second end coupled to said audio input of said amplifier.

13. The computer system of claim 9, further comprising an electromagnetic interference filter coupled between said status signal and said control input of said mute switch.

14. The computer system of claim 13, wherein said electromagnetic interference filter comprises:

a resistor having a first end coupled to said status signal and a second end coupled to said control input of said mute switch; and a capacitor having a first end connected to said control input of said mute switch and a second end coupled to ground.

15. The computer system of claim 9, wherein said power switch is a diode having cathode and anode ends, said anode end coupled to said voltage supply rail, said cathode end coupled to said power supply input of said amplifier.

16. The computer system of claim 9, wherein said CODEC further generates a second audio signal, said apparatus further comprising:

a second amplifier for amplifying said second audio signal, said second amplifier having a volume control input and a power supply input;

a second power switch coupled between said voltage supply rail and said power supply input of said second amplifier, said second power switch enabling power to be transferred only from said voltage supply rail to said power supply input of said second amplifier;

a second energy reservoir coupled to said power supply input of said second amplifier; and a second mute switch having a control input coupled to said status signal and an output coupled to said volume control input of said second amplifier, said second mute switch muting said second amplifier upon the assertion of said status signal.

* * * * *